(12) United States Patent
Ramamurthy et al.

(10) Patent No.: US 7,241,345 B2
(45) Date of Patent: Jul. 10, 2007

(54) CYLINDER FOR THERMAL PROCESSING CHAMBER

(75) Inventors: Sundar Ramamurthy, Fremont, CA (US); Vedapuram Achutharaman, San Jose, CA (US); Ho T. Fang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 389 days.

(21) Appl. No.: 10/463,129

(22) Filed: Jun. 16, 2003

(65) Prior Publication Data

US 2004/0250772 A1    Dec. 16, 2004

(51) Int. Cl.
*C23C 16/00* (2006.01)

(52) U.S. Cl. ..................................... 118/725

(58) Field of Classification Search ............. 118/500, 118/728, 729, 730; 156/345.51; 269/289 R; 427/160, 237, 255.18
See application file for complete search history.

(56) References Cited

U.S. PATENT DOCUMENTS

| | | | | |
|---|---|---|---|---|
| 4,522,819 A | * | 6/1985 | Fox, Jr. et al. | 427/437 |
| 5,050,547 A | * | 9/1991 | Takahashi | 123/193.2 |
| 5,155,336 A | * | 10/1992 | Gronet et al. | 219/411 |
| 5,879,763 A | * | 3/1999 | Sugiyama et al. | 427/577 |
| 6,007,241 A | * | 12/1999 | Yam et al. | 374/131 |
| 6,048,403 A | * | 4/2000 | Deaton et al. | 118/725 |
| 6,157,106 A | | 12/2000 | Tietz et al. | |
| 6,174,080 B1 | * | 1/2001 | Jennings | 374/131 |
| 6,183,130 B1 | * | 2/2001 | Adams et al. | 374/131 |
| 6,226,453 B1 | * | 5/2001 | Yam et al. | 392/418 |
| 6,374,150 B2 | * | 4/2002 | Redinbo et al. | 700/121 |
| 6,406,179 B2 | * | 6/2002 | Adams et al. | 374/131 |
| 6,530,994 B1 | * | 3/2003 | Mahawili | 118/725 |
| 6,630,200 B2 | * | 10/2003 | Wang et al. | 427/255.26 |
| 2004/0060657 A1 | * | 4/2004 | Saigusa et al. | 156/345.1 |

* cited by examiner

*Primary Examiner*—Parviz Hassanzadeh
*Assistant Examiner*—Maureen G. Arancibia
(74) *Attorney, Agent, or Firm*—Moser IP Law Group

(57) ABSTRACT

The cylinder includes a core and a coating covering most of the core. The core is made from a heat-resistant or insulating material. The core has inner and outer side walls and opposing first and second ends. The outer side wall is further away from a central longitudinal axis of the cylinder than the inner wall. The first end is configured to contact an edge ring that supports a semiconductor substrate. The coating is substantially opaque to infrared radiation, and covers all external surfaces of the core except for the first end. The core is preferably made from quartz or ceramics, while the coating is preferably made from a polysilicon.

17 Claims, 6 Drawing Sheets

CYLINDER FOR THERMAL PROCESSING CHAMBER

BACKGROUND OF THE INVENTION

1. Field of the Invention

The present invention relates to semiconductor processing, and more particularly, to a support cylinder used in a thermal processing chamber, such as a Rapid Thermal Processing (RTP) chamber.

2. Description of Related Art

The integrated circuit (IC) market is continually demanding greater memory capacity, faster switching speeds, and smaller feature sizes. One of the major steps the industry has taken to address these demands is to change from batch processing multiple substrates, such as silicon wafers, in large furnaces to processing single substrates in small reaction chambers.

Today, engineers continually strive to increase the throughput of semiconductor substrates while increasing semiconductor yield. The semiconductor substrates referred to herein typically include semiconductor wafers for ultra-large scale integrated (ULSI) circuits.

Generally, there are four basic processes performed in such reaction chambers, namely layering, patterning, doping, and thermal processing. Thermal processing refers to several different processes, including rapid thermal processing (RTP), rapid thermal annealing (RTA), rapid thermal cleaning (RTC), rapid thermal chemical vapor deposition (RTCVD), rapid thermal oxidation (RTO), and rapid thermal nitridation (RTN).

In one RTP process, wafers are loaded into a processing chamber at a temperature of several hundred ° C. in a nitrogen ($N_2$) gas ambient atmosphere. The temperature of the wafer is ramped to reaction conditions, typically at a temperature in the range of about 850° C. to 1200° C. The temperature is raised using a large number of heat sources, such as tungsten halogen lamps, which radiatively heat the wafer. Reactive gases may be introduced before, during, or after the temperature ramp. For example, oxygen may be introduced for growth of silicon dioxide ($SiO_2$).

The uniformity of the thermal process over the surface of the semiconductor substrate during thermal processing is critical to producing uniform semiconductor devices. For example, in the particular application of complementary metal-oxide-semiconductor (CMOS) gate dielectric formation by RTO or RTN, thickness, growth temperature, and uniformity of the gate dielectrics are critical parameters that influence the overall device performance and semiconductor yield. Currently, CMOS devices are being made with dielectric layers that are only 60-80 Å ($10^{-10}$ m) thick and for which thickness uniformity must be held within a few percent. This level of uniformity requires that temperature variations across the substrate during high temperature processing cannot exceed a few degrees Celsius (° C.). Therefore, techniques that minimize temperature non-uniformity are very important.

Temperature uniformity provides uniform process variables over the substrate (e.g., layer thickness, resistivity, and etch depth) for various process steps including film deposition, oxide growth and etching. In addition, temperature uniformity in the substrate is necessary to prevent thermal stress-induced wafer damage, such as warpage, defect generation, and slip. This type of damage is caused by thermal gradients which are minimized by temperature uniformity. The wafer often cannot tolerate even small temperature differentials during high temperature processing. For example, if the temperature differential is allowed to rise above 1-2° C./cm at 1200° C., the resulting stress is likely to cause slip in the silicon crystal. The resulting slip planes will destroy any devices through which they pass. To achieve that level of temperature uniformity, reliable real-time, multi-point temperature measurements are necessary for closed-loop temperature control.

One way of achieving temperature uniformity is by rotating the substrate during processing. This removes the temperature dependence along the azimuthal degree-of-freedom. Because the central axis of the substrate, perpendicular to wafer's surface, is collinear with the axis of rotation 128, all points along any annulus of the wafer (at any arbitrary radius) are exposed to the same amount of illumination. By providing a number of pyrometers and a feedback system, even the remaining radial temperature dependence can be substantially removed, and acceptable temperature uniformity achieved and maintained across the entire substrate.

One example of a type of mechanical rotation system in use today is shown in FIG. 1. This type of system is similar to those used and sold by APPLIED MATERIALS, Inc., of Santa Clara, Calif., U.S.A. Certain details of such systems are provided in U.S. Pat. No. 5,155,336, entitled "Rapid Thermal Heating Apparatus and Method", issued Oct. 13, 1992, assigned to the assignee of the present invention, and incorporated herein by reference. In this type of mechanical rotation system, the substrate support is rotatably mounted on a bearing assembly that is, in turn, coupled to a vacuum-sealed drive assembly. For example, FIG. 1 depicts a partial cross-sectional view of such a system 100. A wafer 102 is placed on an edge ring 104, which is in turn friction-fit on a cylinder 106. The cylinder 106 sits on a ledge of an upper bearing race 108 which is magnetic. The upper bearing race 108 is disposed within well 110 and is supported on a number of ball bearings 121 (only one of which is shown), relative to a lower bearing race 118. The lower bearing race 118 is mounted on a chamber bottom 120. A water-cooled reflector 124 is positioned on the chamber bottom 120 as part of a temperature measuring system. The temperature measuring system relies on a black body or reflector cavity 122 formed between the reflector 124, the wafer 102, the edge ring 104 and the cylinder 106 to accurately measure the temperature of the wafer 102. Further details of such a black body or reflector cavity can be found in Applicants' U.S. Pat. Nos. 6,174,080; 6,007,241; 6,406,179; 6,374,150; 6,226,453; or 6,183,130, all of which are incorporated herein by reference. The temperature measuring system typically includes a number of pyrometers embedded in the chamber bottom 120.

A magnet 114 is located adjacent the portion of chamber bottom 120 opposite the upper magnetic bearing race 108. The magnet 114 is mounted on a motor-driven magnet ring 116. The magnet 114 is magnetically coupled to the magnetic bearing race 108 through the chamber bottom 120. By mechanically revolving the magnet 114 about the central axis 128, the upper bearing race 108 may be made to rotate as it is magnetically coupled to the magnet 114. In particular, torque is transferred to upper bearing race 108 from the motor-driven magnet ring 116. This rotation of the upper bearing race 108 results in the desired rotation of the wafer 102, which is coupled to the upper bearing race through the cylinder 106 and edge ring 104.

Recent advances have led to a magnetically levitated system to avoid particle generation caused by the contact between the ball bearings 121 and the races as well as from the use of lubrication for the bearing system. Such a magnetically levitated system is described in U.S. Pat. No. 6,157,106 to Tietz et al., which is also incorporated herein by reference.

As mentioned above, precise temperature measurement by the temperature measurement system is a critical process parameter. Therefore, it is important to thermally isolate the temperature measurement system and the upper bearing race 108 from radiation generated by the heat source (not shown). Accordingly, the support cylinder 106 is typically made from ceramic or quartz materials due to their excellent thermal insulation properties. One range of values of conductivity that has been found appropriate is about 1.5 to about 2.5 (J-kg-m)/(m$^2$-sec-° C.). In addition, ceramic and quartz are thermally stable and inert to chemicals typically used in thermal processing.

However, these materials (ceramics and quartz) are transparent to infrared radiation produced by the heat source. Accordingly, without an opaque covering, infrared radiation would pass through the support cylinder and interfere with the highly sensitive temperature measurements being taken by the temperature measurement system. Therefore, the support cylinder is usually coated with a material that is opaque to infrared radiation, such as a polysilicon.

A chemical deposition process, such as Chemical Vapor Deposition (CVD) is typically used to coat the cylinder with the polysilicon. This CVD process is typically performed in a CVD reaction chamber, otherwise known as a bell jar chamber, that includes a heat source. A number of support pins, typically three, are placed on top of the heat source. The cylinder is then placed onto the pins, face down, i.e., the top of the support cylinder, proximate the cylinder makes contact with the support pins. The CVD chamber is then sealed and a gas from which the polysilicon is formed, is pumped into the reaction chamber. The chamber is heated and a layer of polysilicon is subsequently formed on the support cylinder, as is well understood in the art. The deposition rate of the polysilicon onto the support cylinder is about 2.3 μm/min at 1100° C.

This process worked relatively well for support cylinders used for 200 mm semiconductor wafers. However, as the industry has moved to 300 mm semiconductor wafers, several drawbacks have been encountered with the existing cylinder and its method of manufacture.

One such drawback is a non-uniform layer of silicon being applied to the cylinder. Because of the large size or volume of the 300 mm support cylinder, and the good heat insulation properties of the cylinder, it is difficult to uniformly heat the cylinder within the CVD chamber. Indeed, there is a lack of understanding on how to uniformly heat quartz. Heating a thin (~0.3"), tall (1") quartz cylinder (OD 13") to a uniform temperature using a 1D heat source (such as the susceptor) is difficult, so is the ability to uniformly coat the cylinder since the process is temperature dependent. This non-uniform heating of the support cylinder results in a non-uniform layer of polysilicon being formed on the surface of the support cylinder, as shown in an exaggerated cross-sectional view of the cylinder in FIG. 2A. This non-uniform layer of polysilicon may compromise the infrared opacity of the cylinder. Indeed, some areas 204 of the cylinder may have thick polysilicon layer, while other areas 202 have no polysilicon layer at all. As mentioned above, if the cylinder were to allow infrared radiation to penetrate the reflector cavity 122 (FIG. 1), false temperature measurements may be taken leading to imprecise temperature control and ultimately defective semiconductor devices and low semiconductor yield.

Another drawback is cracking of the polysilicon layer, as shown in FIG. 2B, which is a second exaggerated cross-sectional view of the support cylinder. Quartz and polysilicon have different coefficients of thermal expansion, and, therefore, heat and cool at different rates. The coefficients of thermal expansion of quartz and polysilicon are 0.5 vs. 3.8, room temperature to 1000 C, (ppm/° C.) or (10^-6 in/in/° C.).

When the current polysilicon layer cools at a different rate to that of the quartz, it forms cracks 206 in the polysilicon 204. To the naked eye, these cracks 206 in the polysilicon cause a snakeskin like appearance on the surface of the cylinder. Cylinders having this snakeskin like appearance are immediately rejected as defective parts. Accordingly, the cost of producing acceptable cylinders is high.

Another drawback of this non-uniform heating of the support cylinder is that exaggerated growth of the polysilicon may occur at some point of the support cylinder and not at others. This exaggerated growth typically takes the form of dendrites, protrusions, or nodules, as shown in a third exaggerated cross-sectional view of the support cylinder shown in FIG. 2C. As the edge ring 104 (FIG. 1) rests on the cylinder, the dendrites or nodules 208 may cause the edge ring to sit or rest improperly, i.e., not flush, on top of the support cylinder. This may lead to instability of the edge ring on the cylinder and/or nonsymmetrical or eccentric rotation of the wafer. In addition, the formation of the dendrites may affect the height of the wafer from the heat source or lamps. This may negatively impact the temperature that each point on the wafer is exposed to and/or the temperature measurements taken by the pyrometers 126 (FIG. 1). In addition, the dendrites or nodules, may compromise the reflector cavity 122 (FIG. 1) by allowing stray infrared radiation to pass between the edge ring 104 (FIG. 1) and the support cylinder 106 (FIG. 1). In other words, the dendrites may cause an imprecise fit between the cylinder and the edge ring, and/or compromise the thermal isolation of the edge ring from the cylinder. These drawbacks could ultimately lead to defective semiconductor devices and low semiconductor yield.

Accordingly, a cylinder that is opaque to infrared radiation, is easy to manufacture, has a uniform polysilicon layer, is free of dendrites and/or nodules, and does not have a polysilicon layer that cracks, would be highly desirable.

SUMMARY OF THE INVENTION

According to the invention there is provided a cylinder for use in a semiconductor thermal processing apparatus, such as an RTP chamber. The cylinder includes a core and a coating covering most of the core. The core is made from a heat-resistant or insulating material. The core has inner and outer side walls and opposing first and second ends. The outer side wall is further away from a central longitudinal axis of the cylinder than the inner wall. The first end is configured to contact an edge ring that supports a semiconductor substrate. The coating is substantially opaque to infrared radiation, and covers all external surfaces of the core except for the first end. The core is preferably made from quartz or ceramics, while the coating is preferably made from a polysilicon.

In a preferred embodiment, the cumulative thickness of the coating at the inner and outer side walls is between about 60 μm to about 100 μm, more preferably between about 70 μm to about 90 μm, and most preferably between about 75 μm to about 85 μm. The cumulative thickness is the combined thickness of the coating at the inner and the outer wall, i.e., A+B (FIG. 3). The coating preferably has a substantially uniform thickness. Also in a preferred embodiment, the inner side wall is at least partially tapered towards the outer side wall near the first end.

Further according to the invention there is provided a method for making a cylinder for use in a thermal processing apparatus, such as a RTP chamber. Initially, a reaction chamber and a heat-resistant cylindrical core is provided.

The core has inner and outer side walls and opposing first and second ends. The first end is configured to support an edge ring. The core is placed on a ring within a reaction chamber, with the first end in contact with the ring. The reaction chamber is sealed and heated to about 1100° C. A gas from which a coating is produced is then injected into the reaction chamber. This deposits a coating over substantially all external surfaces of the core except for the first end. The coating is substantially opaque to infrared radiation. The heating and the injecting is controlled such that the deposition of the coating occurs at between about 1.6 µm/min to about 1.8 µm/minute. The core is a quartz or ceramic and the coating is a polysilicon.

Accordingly, the above described cylinder has a uniform polysilicon coating that is sufficient to block infrared radiation. The uniform polysilicon coating is free of dendrites and/or nodules, thereby allowing the edge ring to sit squarely on the cylinder's first end. This also addresses any eccentric rotation that may be caused by the edge ring sitting incorrectly on the cylinder. Furthermore, such a cylinder prevents radiation from entering the reflector cavity via the interface between the cylinder and the edge ring. Finally, the uniform polysilicon coating does not crack, thereby avoiding part rejections.

Accordingly, a uniform coating provides better wafer temperature uniformity, allows for better temperature measurements and temperature control, and better repeatability.

BRIEF DESCRIPTION OF THE DRAWINGS

Additional objects and features of the invention will be more readily apparent from the following detailed description and appended claims when taken in conjunction with the drawings, in which:

Figure 1:
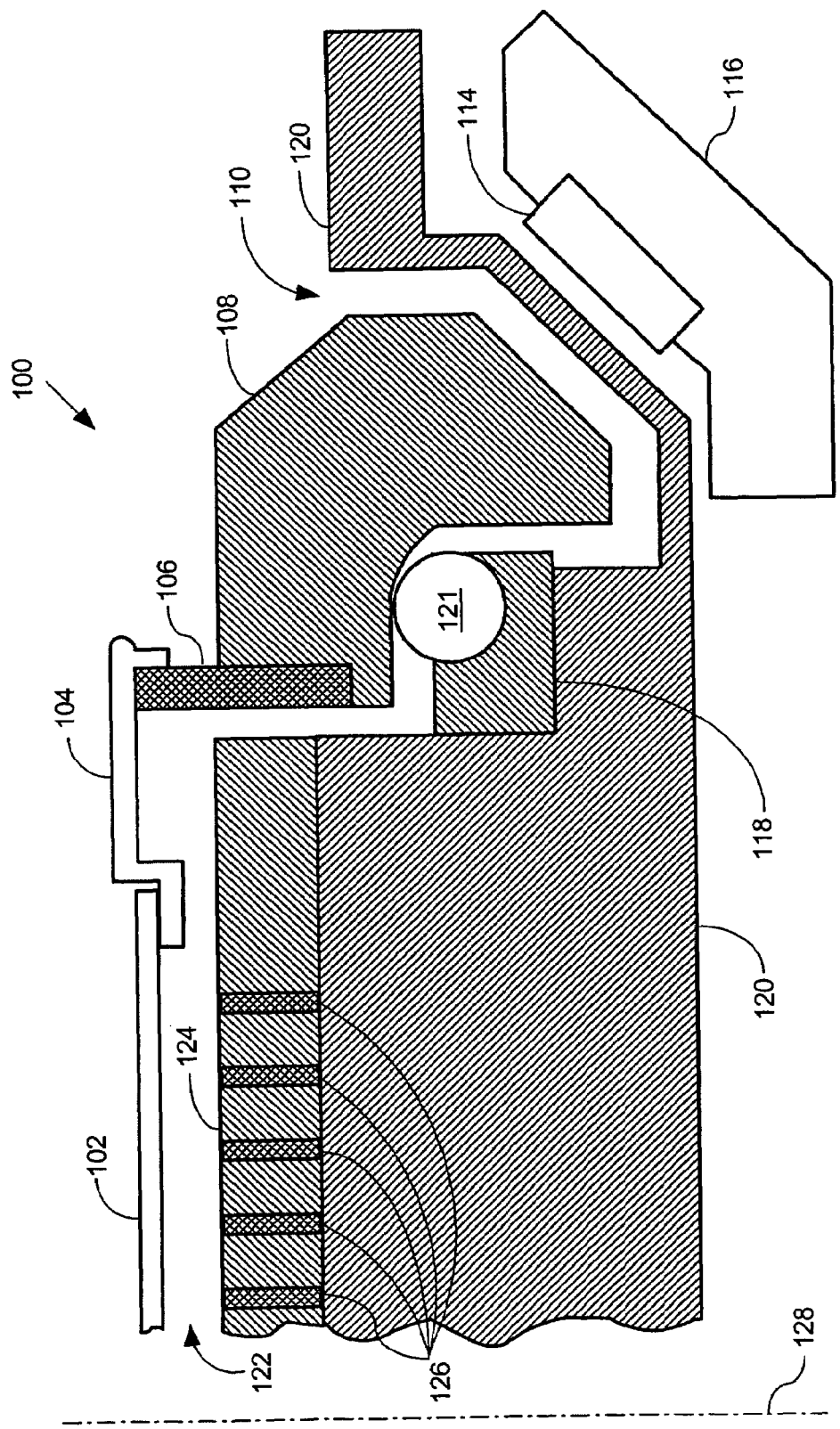
FIG. 1 is partial cross-sectional view of a thermal processing chamber.
Figure 2A:
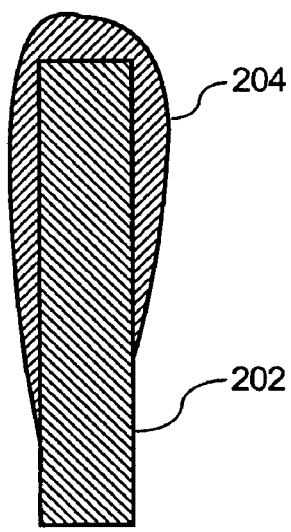
FIG. 2A is an exaggerated cross-sectional view of a prior art cylinder having a non-uniform polysilicon layer.
Figure 2B:
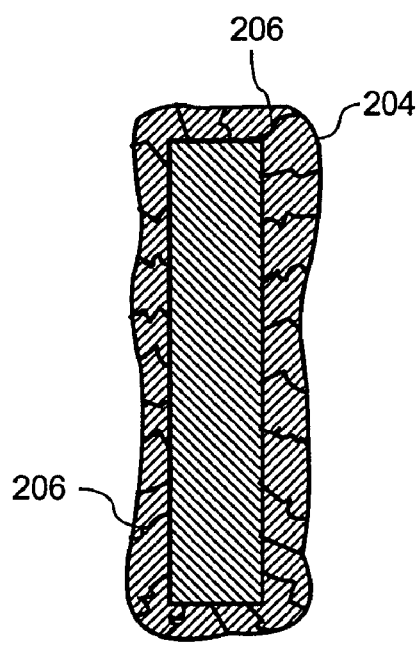
FIG. 2B is an exaggerated cross-sectional view of a prior art cylinder having cracks in the polysilicon layer.
Figure 2C:
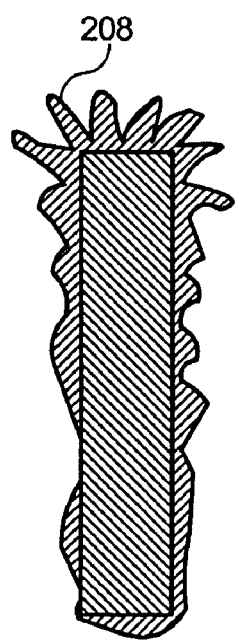
FIG. 2C is an exaggerated cross-sectional view of a prior art cylinder with dendrites or nodules formed from the polysilicon layer.

Like reference numerals refer to corresponding parts throughout the several views of the drawings. For ease of reference, the first number(s) of any reference numeral generally indicates the Figure number in which the reference numeral was first shown. For example, 102 can be found in FIG. 1, and 308 can be found in FIG. 3.

DETAILED DESCRIPTION OF PREFERRED EMBODIMENTS

Figure 3:
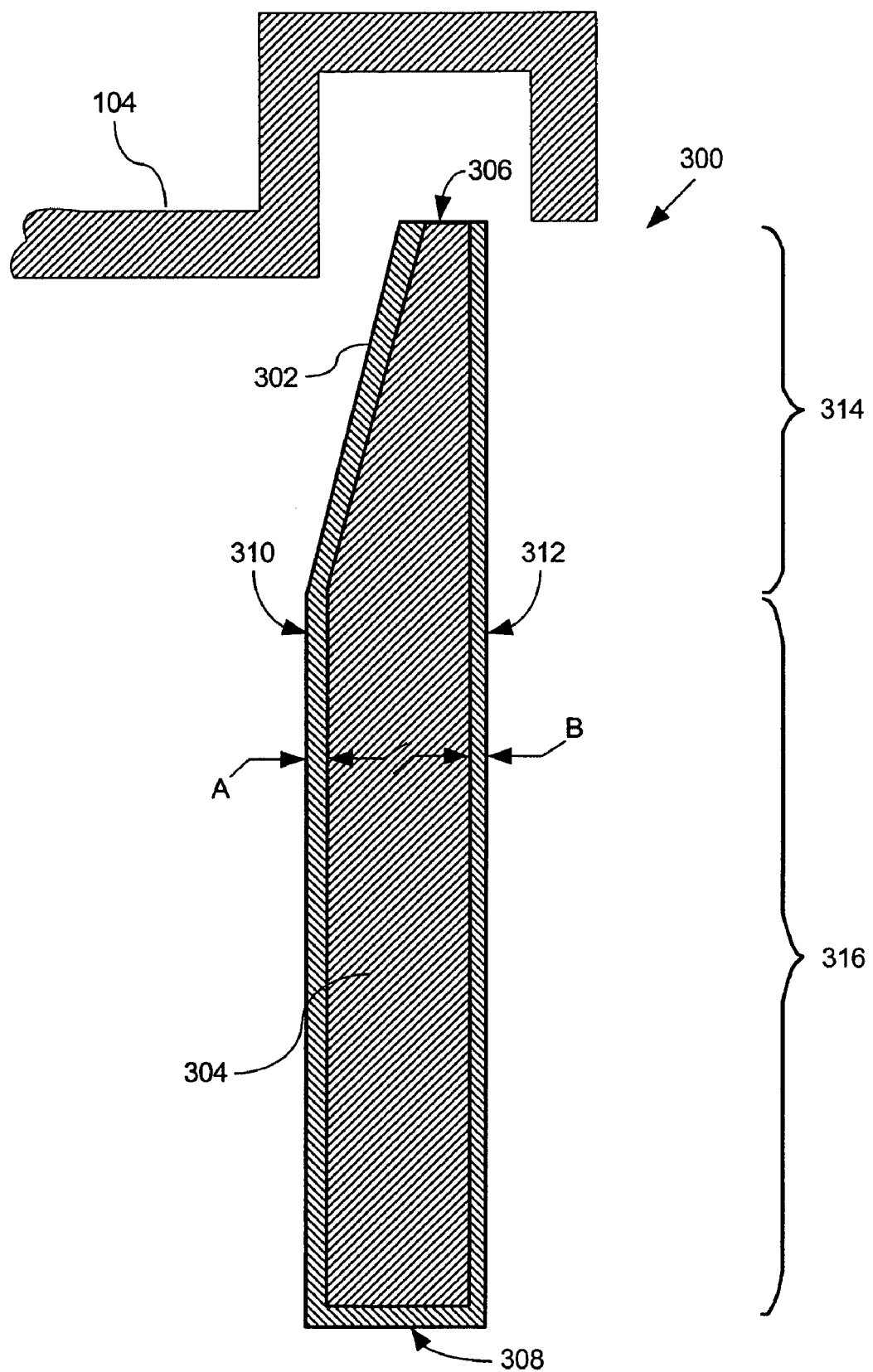
FIG. 3 is a cross-sectional view of a cylinder according to an embodiment of the invention.

FIG. 3 is a cross-sectional view of a cylinder 300. The complete cylinder is cylindrical or annular in shape. An edge ring 104 that supports the wafer is shown above the cylinder 300. In use, the edge ring 104 rests on the cylinder 300. The cylinder 300 comprises a core 304 covered by a coating 302. The core 304 is preferably made from a ceramic or quartz material having good thermal insulation properties. The cylinder 300 is also preferably made from a material that is chemically inert to the type of chemicals typically used in thermal processing environments.

The coating 302 is opaque to infrared radiation. In a preferred embodiment, the coating is a polysilicon (polycrystalline silicon). The coating 302 also preferably has a substantially uniform thickness, i.e., thickness A is the same as thickness B.

The cylinder 300 has a first end 306 configured to contact with an edge ring 104, and a second end 308 distal from said first end 306. The first and second ends are preferably perpendicular to the axis of rotation 128 (FIG. 1) of the cylinder. The cylinder 300 also includes an inner side wall 310 and an opposing outer side wall 312. The inner side wall 310 is closer to the rotational axis 128 (FIG. 1) than the outer side wall 312. Both the inner side wall 310 and the outer side wall 312 extend from the first end 306 to the second end 308.

The cylinder preferably includes first and second regions 314 and 316, respectively, along a length of the cylinder between the first and second ends. The first region 314 is closer to the first end 306, while the second region 316 is closer to the second end 308. In the second region 316, the inner and outer side walls are preferably parallel to one another. However, in the first region, the inner side wall 310 preferably tapers toward the outer side wall 312, from the junction with the second region to the first end 306. This allows outer side wall to remain straight/flat to mate with the edge ring.

In an alternative embodiment, the outer side wall 312 tapers towards the inner side wall 310, from the junction with the second region to the first end 306. In yet another embodiment, the inner side wall 310 and the outer side wall 312 taper towards one another, from the junction with the second region to the first end 306. In any configuration, the area at the first end 306 perpendicular to the axis of rotation 128 (FIG. 1) is preferably smaller than the area at the second end 308 perpendicular to the axis of rotation 128 (FIG. 1). This allows for better thermal insulation of the edge ring 104 from the cylinder 300.

In a preferred embodiment, the coating 302 covers the exterior surface of the core 304, except for the first end 306 perpendicular to the axis of rotation 128 (FIG. 1) of the cylinder 300. This lack of a coating at the first end 306 creates a flat seat for the edge ring 104 to rest on. As the coating 302 is not applied to the first end 306, the fit between the first end 306 and the edge ring 104 can be better controlled. Furthermore, the first end 306 of the core 304 is preferably machined, which allows for the creation of a more precise edge substantially perpendicular to the axis of rotation. The edge ring 104 is preferably made from silicon carbide (SiC), which is opaque to infrared radiation. Accordingly, the first end 306 does not need to be coated with the opaque coating 302, as the boundary formed between the first end 306 and the edge ring 104 does not allow radiation to pass into the reflector cavity 122.

In a preferred embodiment, the thickness of the coating A together with the thickness of the coating B, otherwise known as the cumulative thickness, is between about 60 µm to about 100 µm, i.e., 60 µm≦A+B≦100 µm. In a more preferred embodiment, the thickness A together with the thickness B is between about 70 µm to about 90 µm, i.e., 70 µm≦A+B≦90 µm. In a more preferred embodiment, the thickness A together with the thickness B is between about 75 µm to about 85 µm, i.e., 75 µm≦A+B≦85 µm. These thicknesses have been found to be sufficient to block radiation from entering the reflector cavity 122.

Figure 6A:
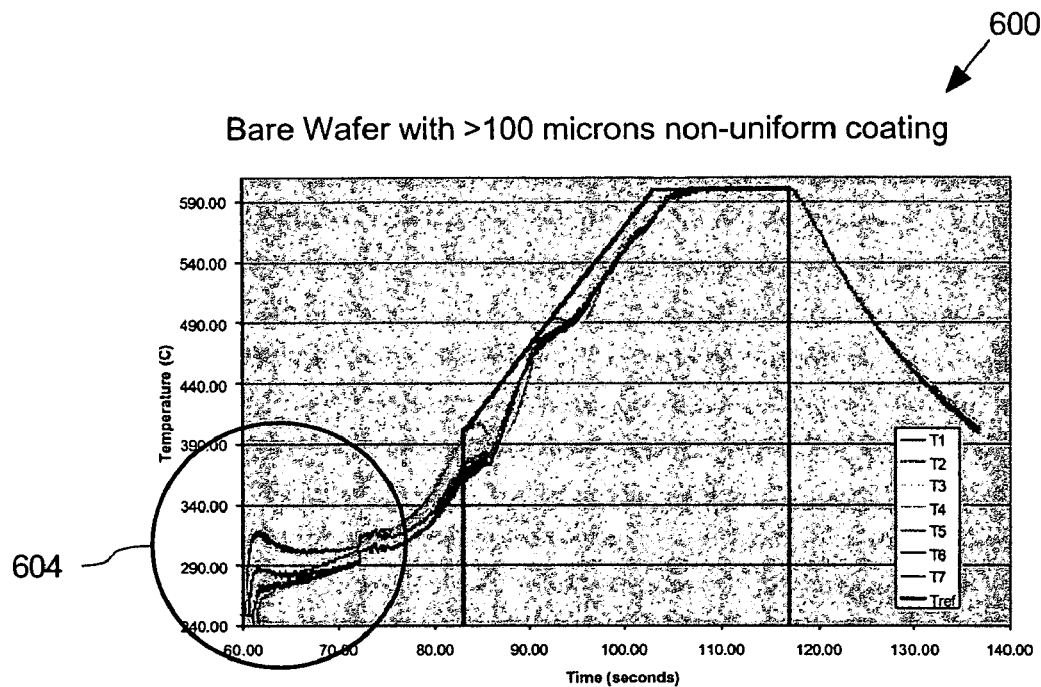
FIG. 6A shows an experimental graph of temperature versus time using a non-uniform cylinder.
Figure 6B:
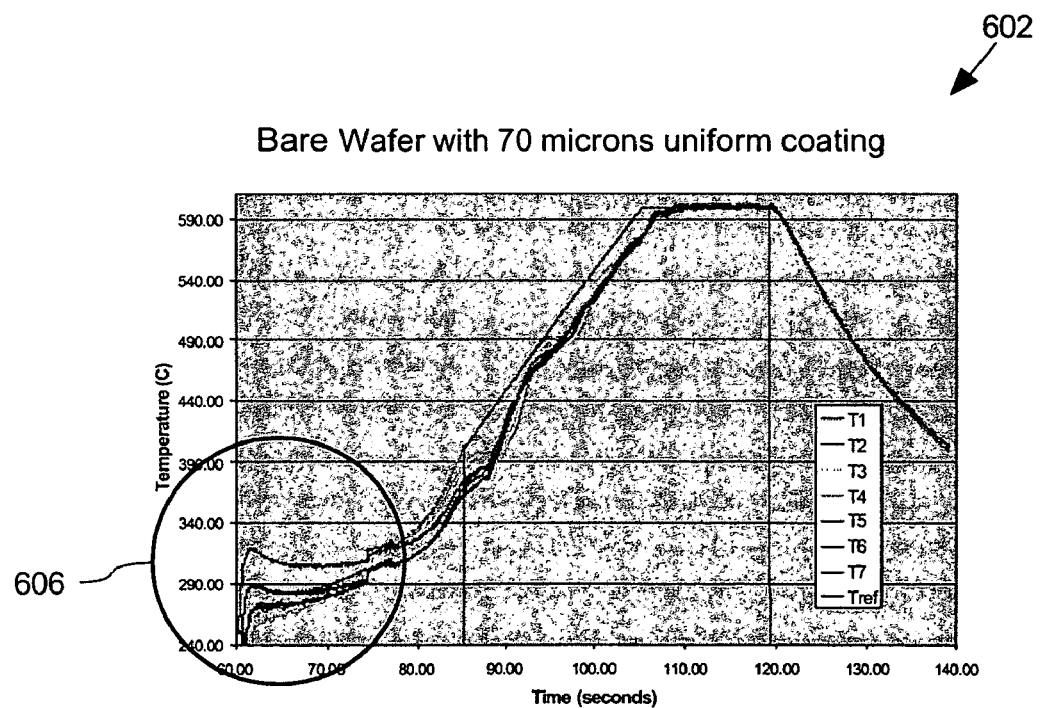
FIG. 6B is an experimental graph of temperature versus time using a cylinder having a uniform thinner coating, according to an embodiment of the invention.

It was previously believed that thinner coatings, as described immediately above, could not provide sufficient insulation from stray radiation. However, it has been found that substantially thinner uniform coatings provide satisfactory insulation from stray radiation. For example, FIG. 6A shows an experimental graph 600 of temperature versus time using a non-uniform cylinder having a coating with a cumulative thicknesses between above 100 microns (μm). FIG. 6B is an experimental graph 602 of temperature versus time using a cylinder having a uniform coating of 70 μm. The experiments from which these graphs were derived, measured the temperature of a bare 300 mm wafer in an RTP chamber. A bare wafer is wafer without any semiconductors formed thereon. T1 to T7 represent the temperature measurements taken by seven pyrometers extending radially from the center of the wafer. The regions of interest, marked by reference numerals 604 and 606, show an initial jump in temperature readings indicative of radiation leakage through the cylinder. The degree of overshoot is different for each pyrometer depending on its location and the chamber. As can be seen from the graphs, there is very little difference, if any, between the temperature readings taken by the pyrometers in regions 604 and 606. Accordingly, a cylinder with a uniform coating of 70 μm prevents radiation leakage equally as well as a cylinder having a non-uniform coating of 100 μm.

Figure 4:
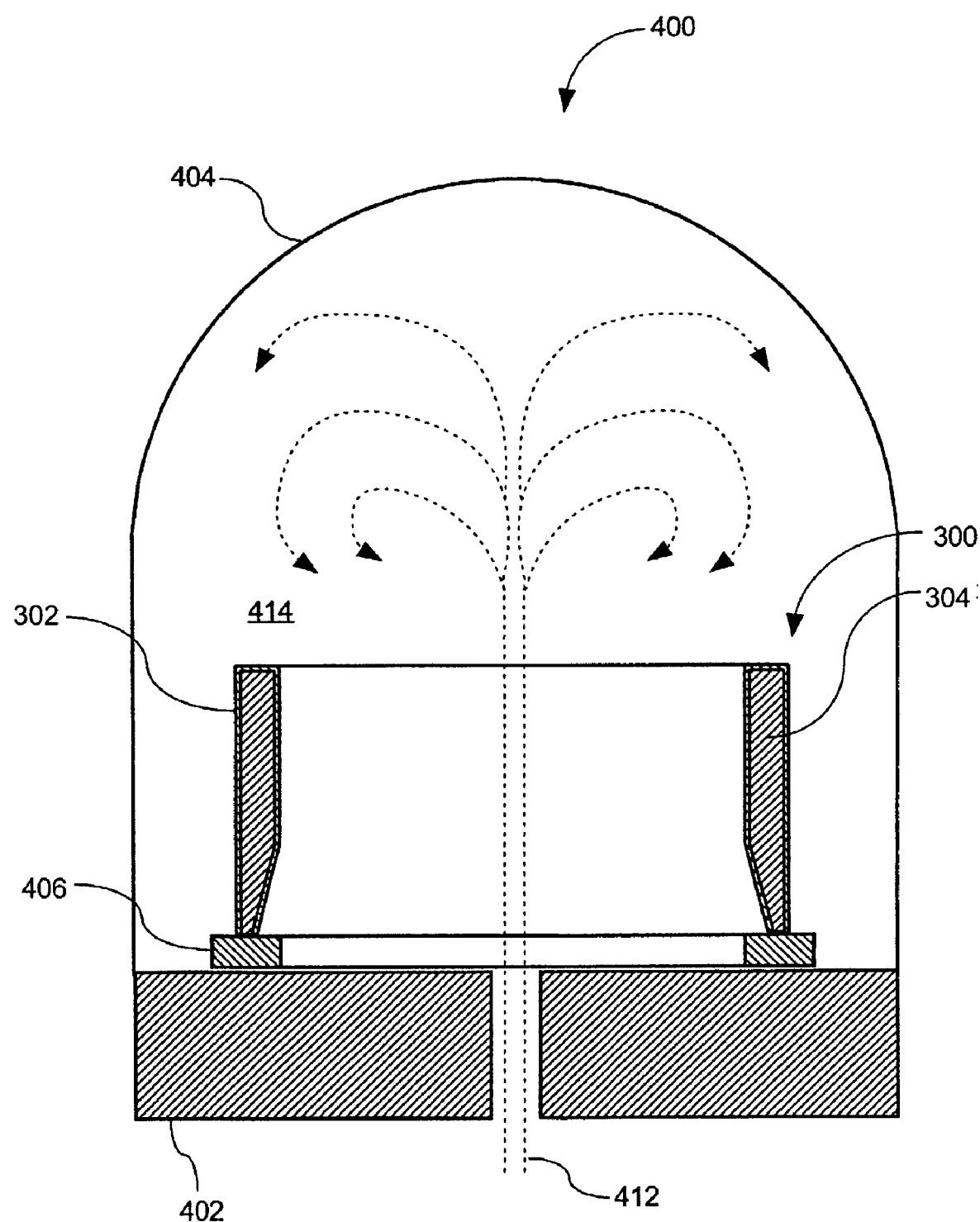
FIG. 4 is a cross-sectional view of a deposition apparatus according to an embodiment of the invention.
Figure 5:
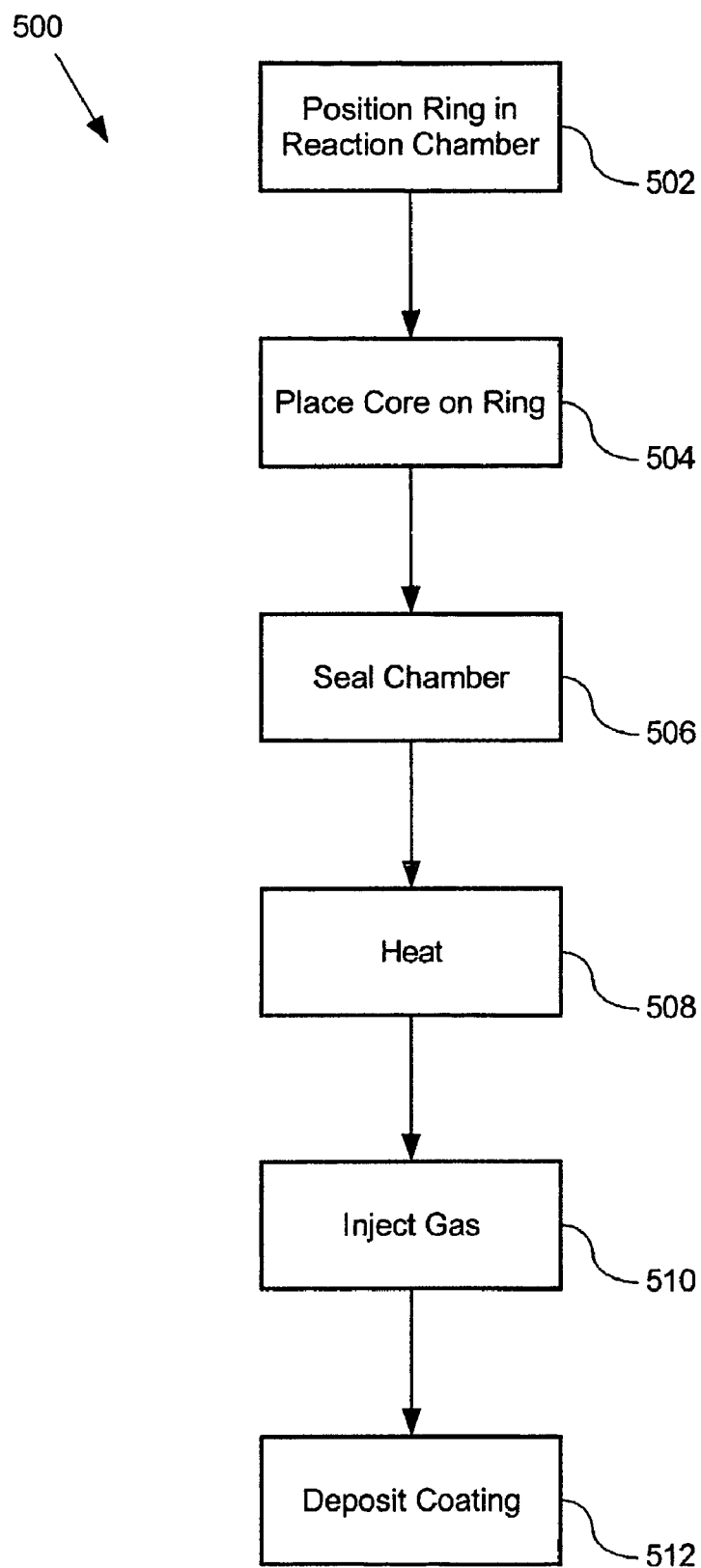
FIG. 5 is a flow chart of a method for making the cylinder of FIG. 3 using the deposition apparatus of FIG. 4.

FIG. 4 is a cross-sectional view of a deposition apparatus 400 for depositing the opaque coating 302 on the core 304 of the cylinder 300, while FIG. 5 is a flow chart 500 of a method for depositing the coating 302 onto the core 304. A suitable apparatus is the Gemini III Reactor originally made by GEMINI and serviced by CIBE SYSTEMS. The apparatus 400 includes a base 402, a heat source (not shown) embedded into the base 402, and a cover 404. The heat source is preferably a graphite receptor and/or resistive heater. The cover 404 is secured to the base 402 to form a reaction chamber 414 therein.

In use, a fixture ring 406 is positioned within the reaction chamber 414 at step 502. The fixture ring is preferably made from silicon carbide (the same material that the edge ring is preferably made from). The first end 306 (FIG. 3) of the core 304 is placed in contact with the edge ring, i.e., the cylinder 300 is positioned first end down, at step 504. The reaction chamber 414 is sealed at step 506. The heat source then heats the reaction chamber 414 to the desired process temperature at step 508. In a preferred embodiment the reaction chamber is then heated to between about 1100° C. to about 1250° C. In a most preferred embodiment, the chamber is heated to 1220° C.+/−5° C. A deposition gas 412 from which the coating 302 is formed, is then injected into the reaction chamber 414 at step 510. In a preferred embodiment this gas is trichlorosilane (TCS) in a carrier gas of Helium (He). The reaction of the injected gas and the heat cause a layer of polysilicon to be deposited on all exposed surfaces of the core 304, at step 512, except for the first end 306 (FIG. 3) of the core that is masked by the fixture ring 406.

In a preferred embodiment, the coating 302 is deposited onto the core 304 at a deposition rate of about 1.6 μm/min to 1.8 μm/minute at about 1220° C.+/−5° C. This deposition rate is substantially slower than the prior art, allowing for a more controlled deposition. This increase in control allows a substantially uniform coating thickness to be formed on the core. Also, this increased control reduces or substantially eliminates the formation of dendrites and nodules. The thinner coating also reduces or eliminates cracking of the polysilicon.

The foregoing descriptions of specific embodiments of the present invention are presented for purposes of illustration and description. They are not intended to be exhaustive or to limit the invention to the precise forms disclosed. Obviously many modifications and variations are possible in view of the above teachings. For example, different coating techniques may be employed. The embodiments were chosen and described in order to best explain the principles of the invention and its practical applications, to thereby enable others skilled in the art to best utilize the invention and various embodiments with various modifications as are suited to the particular use contemplated. Furthermore, the order of steps in the method are not necessarily intended to occur in the sequence laid out. It is intended that the scope of the invention be defined by the following claims and their equivalents. In addition, any references cited above are incorporated herein by reference.

What is claimed is:

1. A cylinder for use in a semiconductor substrate thermal processing apparatus, comprising:
    a heat-resistant substantially cylindrical core formed from quartz, said core having inner and outer side walls and opposing first and second ends, where said first end is configured to contact an edge ring adapted for supporting a semiconductor substrate; and
    a polysilicon coating substantially opaque to infrared radiation, where said coating covers all external surfaces of said core except for a surface of said first end.

2. The cylinder of claim 1, wherein a cumulative thickness of said coating on the inner and outer side walls is between about 60 μm to about 100 μm.

3. The cylinder of claim 1, wherein a cumulative thickness of said coating on the inner and outer side walls is between about 70 μm to about 90 μm.

4. The cylinder of claim 1, wherein a cumulative thickness of said coating on the inner and outer side walls is between about 75 μm to about 85 μm.

5. The cylinder of claim 1, wherein a thickness of said coating is substantially uniform.

6. The cylinder of claim 1, wherein said inner side wall is at least partially tapered towards said outer side wall near said first end.

7. The cylinder of claim 1, wherein said inner and outer side walls have a first region near said first end and a second region near said second end, wherein said outer side wall has co-linear first and second regions and said first region of said inner side wall tapers towards said outer side wall near said first end.

8. The cylinder of claim 1, wherein said polysilicon is deposited on all portions of said core except said first end.

9. The cylinder of claim 8, wherein said first end is machined perpendicular to a centerline of said core.

10. The cylinder of claim 8, wherein said polysilicon is deposited by a chemical vapor deposition reaction to a thickness of between about 70 μm to 90 μm at a rate of about 1.6 to about 1.8 μm per minute.

11. The cylinder of claim 8, wherein said polysilicon is formed from trichlorosilane (TCS) gas at a temperature between about 1100 degrees Celsius to about 1250 degrees Celsius.

12. A cylinder for use in an apparatus for thermal processing of a workpiece, comprising:
    a substantially cylindrical core having thermal insulation properties, said core formed from quartz and having inner and outer side walls and opposing first and second ends, where said first end is configured to support an edge ring for supporting the workpiece; and
    a polysilicon coating substantially covering surfaces of said core except for a surface of said first end, where said coating is substantially opaque to infrared radiation, and wherein a cumulative thickness of said coating on the inner and outer side walls less than about 100 μm.

13. The cylinder of claim 12, wherein a cumulative thickness of said coating on the inner and outer side walls is between about 70 μm to about 90 μm.

14. The cylinder of claim 12, wherein a cumulative thickness of said coating on the inner and outer side walls is between about 75 μm to about 85 μm.

15. The cylinder of claim 12, wherein a thickness of said coating is substantially uniform.

16. The cylinder of claim 12, wherein said inner side wall is at least partially tapered towards said outer side wall near said first end.

17. A cylinder for use in an apparatus for thermal processing of a workpiece, comprising:

a substantially cylindrical core having thermal insulation properties, said core formed from quartz and having inner and outer side walls and opposing first and second ends, where said first end is configured to support an edge ring for supporting the workpiece; and a polysilicon coating substantially covering surfaces of said core except for a surface of said first end, where said coating is substantially opaque to infrared radiation and wherein a cumulative thickness of said coating on the inner and outer side walls is between about 60 μm to about 100 μm.

* * * * *